(12) United States Patent
Katakura

(10) Patent No.: US 7,631,030 B2
(45) Date of Patent: Dec. 8, 2009

(54) SINE WAVE MULTIPLICATION CIRCUIT AND SINE WAVE MULTIPLICATION METHOD

(75) Inventor: Masayuki Katakura, Kanagawa (JP)

(73) Assignee: Sony Corporation, Tokyo (JP)

( * ) Notice: Subject to any disclaimer, the term of this patent is extended or adjusted under 35 U.S.C. 154(b) by 1094 days.

(21) Appl. No.: 11/049,784

(22) Filed: Feb. 3, 2005

(65) Prior Publication Data

US 2005/0195014 A1 Sep. 8, 2005

(30) Foreign Application Priority Data

Feb. 16, 2004 (JP) ............................ P2004-038066

(51) Int. Cl.
*G06G 7/16* (2006.01)

(52) U.S. Cl. .................. 708/835; 708/801; 327/355

(58) Field of Classification Search ........................ None
See application file for complete search history.

(56) References Cited

U.S. PATENT DOCUMENTS

| | | | |
|---|---|---|---|
| 3,935,439 A | * | 1/1976 | Buss et al. .................. 708/818 |
| 4,084,256 A | * | 4/1978 | Engeler et al. ............... 708/835 |
| 4,156,284 A | * | 5/1979 | Engeler ........................ 257/39 |
| 4,241,320 A | * | 12/1980 | Fausone et al. ............... 333/18 |
| 4,727,333 A | * | 2/1988 | Dieterich ..................... 341/143 |

FOREIGN PATENT DOCUMENTS

| | | |
|---|---|---|
| JP | 63-165978 | 7/1988 |
| JP | 01-204510 | 8/1989 |

OTHER PUBLICATIONS

Japanese Office Action issued on Oct. 31, 2006.
Gilbert, Barrie, "A Precise Four-Quadrant Multiplier with Subnanosecond Response", IEEE Journal of Solid State Circuits, vol. SC-3, No. 4, Dec. 1968, pp. 365-373.

* cited by examiner

*Primary Examiner*—Lewis A Bullock, Jr.
*Assistant Examiner*—Michael Yaary
(74) *Attorney, Agent, or Firm*—Sonnenschein Nath & Rosenthal LLP

(57) ABSTRACT

A sine wave multiplication circuit multiplies an analog input signal by n (n is an integer equal to or greater than 2) weighting coefficients each having a unique value. The polarity of the analog input signal multiplied by one of the n weighting coefficients is changed over. Further, changeover among the n weighting coefficients and of the polarity is performed after every sampling period equal to $1/2k$ (k is an integer, and 2k is equal to or greater than 6 but equal to or smaller than 4n) of one period of the sine wave signal by which the analog input signal is multiplied. As a result, a staircase waveform having 2n positive and negative stairs is generated while unnecessary harmonic wave components in the proximity of the sine wave signal by which the analog input signal is multiplied can be reduced.

4 Claims, 17 Drawing Sheets

HALF CYCLE

HALF CYCLE

HALF CYCLE

HALF CYCLE

SINE WAVE MULTIPLICATION CIRCUIT AND SINE WAVE MULTIPLICATION METHOD

RELATED APPLICATION DATA

The present application claims priority to Japanese Application(s) No(s). P2004-038066 filed Feb. 16, 2004, which application(s) is/are incorporated herein by reference to the extent permitted by law.

BACKGROUND OF THE INVENTION

This invention relates to a sine wave multiplication circuit and a sine wave multiplication method for multiplying a certain analog signal by a sine wave signal, and more particularly to an analog sine wave multiplication circuit and an analog sine wave multiplication method for a sine wave signal.

It is one of the most basic functions in various signal processes to multiply a certain signal by a sine wave. For example, in frequency conversion of shifting a certain signal by a desired frequency, a sine wave multiplication circuit is required. Further, a sine wave multiplication circuit is required essentially also for conversion of a frequency band of a signal into a frequency band in the proximity of zero (direct current) in frequency in order to detect an arbitrary frequency component of the signal.

Here, for example, taking arithmetic operation for determination of an accurate sum of two sine waves as an example, arithmetic operation of $$e^{j(\omega 1 t+\theta 1)} \cdot e^{j(\omega 2 t+\theta 2)} = e^{j\{(\omega 1+\omega 2)t+\theta 1+\theta 2\}} \quad (1)$$

is examined.

Actually, in order to determine the real part of the expression (1) above, arithmetic operation given by the following expression (2) should be performed:

$$\text{Cos}(\omega 1 t+\theta 1)\cdot\text{Cos}(\omega 2 t+\theta 2)-\text{Sin}(\omega 1 t+\theta 1)\cdot\text{Sin}(\omega 2 t+\theta 2) = \text{Cos}\{(\omega 1+\omega 2)t+\theta 1+\theta 2\} \quad (2)$$

The expression (2) above can be implemented, for example, by two analog multiplication circuits. The multiplication circuit used here is called Gilbert multiplier and is disclosed in BARRIE GILBERT, "A Precise Four-Quadrant Multiplier with Subnanosecond Response", IEEE JOURNAL OF SOLID-STATE CIRCUITS, Vol. SC-3, No. 4, December 1968, pp. 365-373 (hereinafter referred to as Non-Patent Document 1). A circuit configuration of the Gilbert multiplier is shown in FIG. 23.

However, a high degree of accuracy in arithmetic operation cannot be anticipated with such an analog multiplier as described above. The most serious problem is an offset. Transistors of the Gilbert multiplier of FIG. 23 involve mismatching in characteristic. As a result, an offset voltage is superposed equivalently on each of four input signals to the Gilbert multiplier of FIG. 23. As a result, a feed-through phenomenon that the components appear as they are on the output occurs. Further, if the two multiplication circuits 101 and 102 have mismatching in gain, then not only a component of the sum of frequencies ω1 and ω2 but also another component of the difference between the frequencies ω1 and ω2, that is, an image component, appear on the output.

The components can be described in connection with a signal spectrum illustrated in FIGS. 24A and 24B. The output (b) with regard to signals ω1 and ω2 of the input (a) exhibits, in addition to a desired signal of the signal ω1+ω2, feed-through values of the input signals ω1 and ω2 themselves and an image component of the signal ω1−ω2. This is caused by offset voltages of the analog multiplication circuits and a gain error between the two multiplication circuits 101 and 102.

The feed-through matters particularly. The Gilbert multiplier shown in FIG. 23 has such a narrow dynamic range of an input thereto that, in order to use the Gilbert multiplier in a linear region, only a signal of an amplitude of approximately 10 to 20 m Vp−p can be inputted. In contrast, the offset voltage of transistors usually is approximately 1 mV. Accordingly, the feed-through can be suppressed only by approximately −20 dB of the desired signal. In order to further reduce the feed-through, special measures (for example, trimming) in layout or circuit design are required. Even though, it is considerably difficult to assure −40 dB.

SUMMARY OF THE INVENTION

It is an object of the present invention to provide a sine wave multiplication circuit and a sine wave multiplication method which can achieve reduction of the feed-through and an image component.

In order to attain the object described above, according to an aspect of the present invention, there is provided a sine wave multiplication circuit for multiplying an analog signal by a sine wave signal, comprising a weighting section having n weighting coefficient each having a unique value for multiplying the analog input signal by the weighting coefficients, n being an integer equal to or greater than 2, a polarity changeover section for changing over the polarity of the analog input signal outputted from the weighting section after multiplied by one of the n weighting coefficients, and a control section for performing changeover among the n weighting coefficients and changeover of the polarity after every sampling period equal to ½k of one period of the sine wave signal by which the analog input signal is multiplied, k being an integer, 2k being equal to or greater than 6 but equal to or smaller than 4n.

According to another aspect of the present invention, there is provided a sine wave multiplication method for multiplying an analog signal by a sine wave signal, comprising a first step of multiplying the analog input signal by n weighting coefficient each having a unique value, n being an integer equal to or greater than 2, a second step of changing over the polarity of the analog input signal multiplied by one of the n weighting coefficients, and a third step of performing changeover among the n weighting coefficients and changeover of the polarity after every sampling period equal to ½k of one period of the sine wave signal by which the analog input signal is multiplied, k being an integer, 2k being equal to or greater than 6 but equal to or smaller than 4n.

In the sine wave multiplication circuit and the sine wave multiplication method, the number of weighting coefficients by which the analog input signal is to be multiplied is set to n, and the weighting coefficient to be used for the multiplication and the polarity of the weighting coefficient are changed over after every sampling period such that a staircase waveform having 2n positive and negative stairs is generated. In other words, the sine wave signal by which the analog input signal is to be multiplied becomes equivalent to a staircase wave. Consequently, unnecessary harmonic waves in the proximity of the sine wave signal used for the multiplication are suppressed to very low levels. Further, where the circuit for generating the sine wave signal is configured such that the n weighting coefficient are set and the weighting coefficient and the polarity are changed over, it can be formed from a resistor network and switch elements for determining the weighting coefficients. Consequently, the offset and the error in coefficient are very small when compared with those of an alternative sine wave multiplication circuit which is formed using transistors.

With the sine wave multiplication circuit and the sine wave multiplication method, since the sine wave signal by which the analog input signal is multiplied is equivalent to a staircase wave, unnecessary harmonic waves in the proximity of the sine wave signal used for the multiplication can be suppressed to very low levels. Consequently, an analog multiplication result of a very high degree of accuracy having a very small feed-through or image component can be obtained.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

Figure 1:
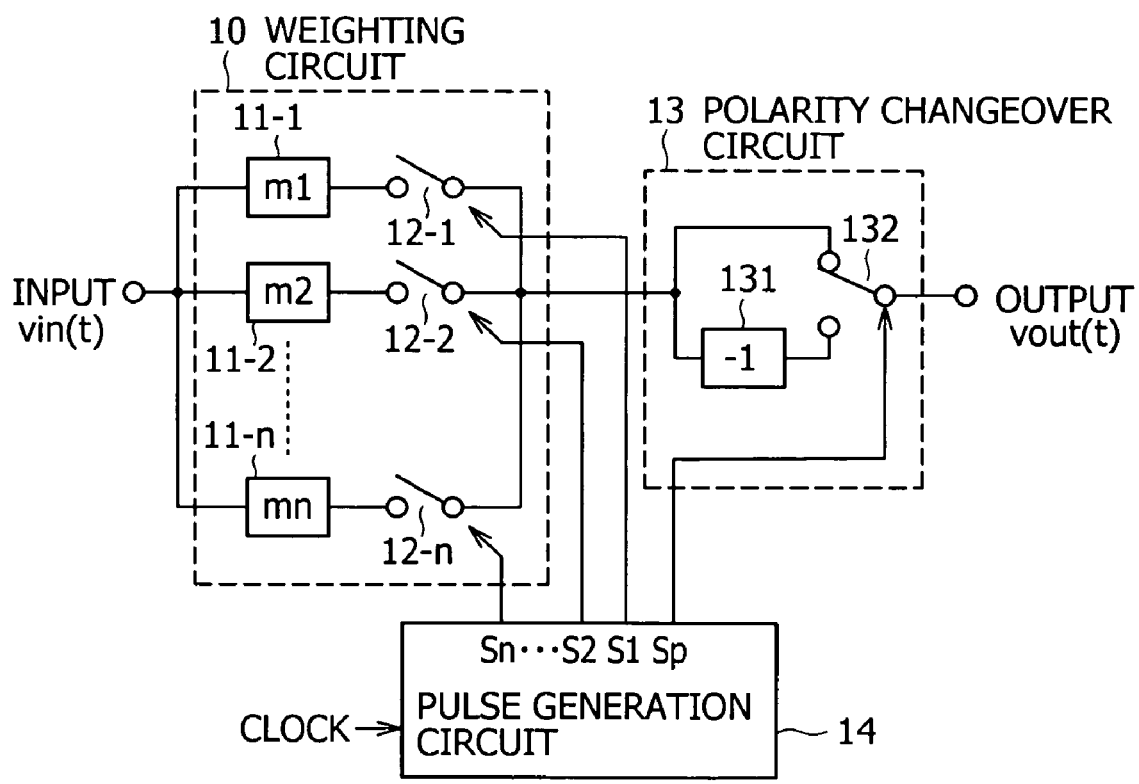
FIG. 1 is a block diagram showing a basic configuration of a sine wave multiplication circuit to which the present invention is applied.

Referring to FIG. 1, there is shown a basic configuration of a sine wave multiplication circuit to which the present invention is applied.

The sine wave multiplication circuit shown includes n coefficient circuits 11-1 to 11-n for multiplying an analog input signal vin(t) by n coefficients m1 to mn each having a unique value, n coefficient selection switches 12-1 to 12-n for selecting the coefficient circuits 11-1 to 11-n, respectively, and a polarity changeover circuit 13 for changing over the polarity of an analog signal outputted from one of the coefficient selection switches 12-1 to 12-n. The sine wave multiplication circuit further includes a pulse generation circuit 14 serving as a control section for changing over the selection of the coefficient circuits 11-1 to 11-n (selection of the analog input signal multiplied by one of the n coefficients m1 to mn) and the polarity of the polarity changeover circuit 13 after every sampling period equal to ½k (k is an integer, 2k being equal to or higher than 6 but equal to or lower than 4n) of the cycle of the sine wave signal by which the analog input signal vin(t) is to be multiplied.

In the sine wave multiplication circuit, the n coefficient circuits 11-1 to 11-n and the n coefficient selection switches 12-1 to 12-n form a weighting circuit 10. The number n of the n coefficient circuits 11-1 to 11-n is at least 2. The polarity changeover circuit 13 includes an inverting amplifier 131 having a gain of −1, and a path changeover switch 132 for changing over between a path which includes the inverting amplifier 131 and another path which does not include the inverting amplifier 131. The pulse generation circuit 14 generates pulse signals S1 to Sn and SP for controlling the coefficient selection switches 12-1 to 12-n and the path changeover switch 132 to change over in response to a predetermined clock, respectively. The polarities of the weighting coefficients (unique values) of the coefficient circuits 11-1 to 11-n and the polarity changeover circuit 13 are set such that the products of the weighting coefficients and the polarities after changeover for each one sampling period increase in proportion to instantaneous values of the sine wave signal at instantaneous times for each sampling period.

Figure 2:
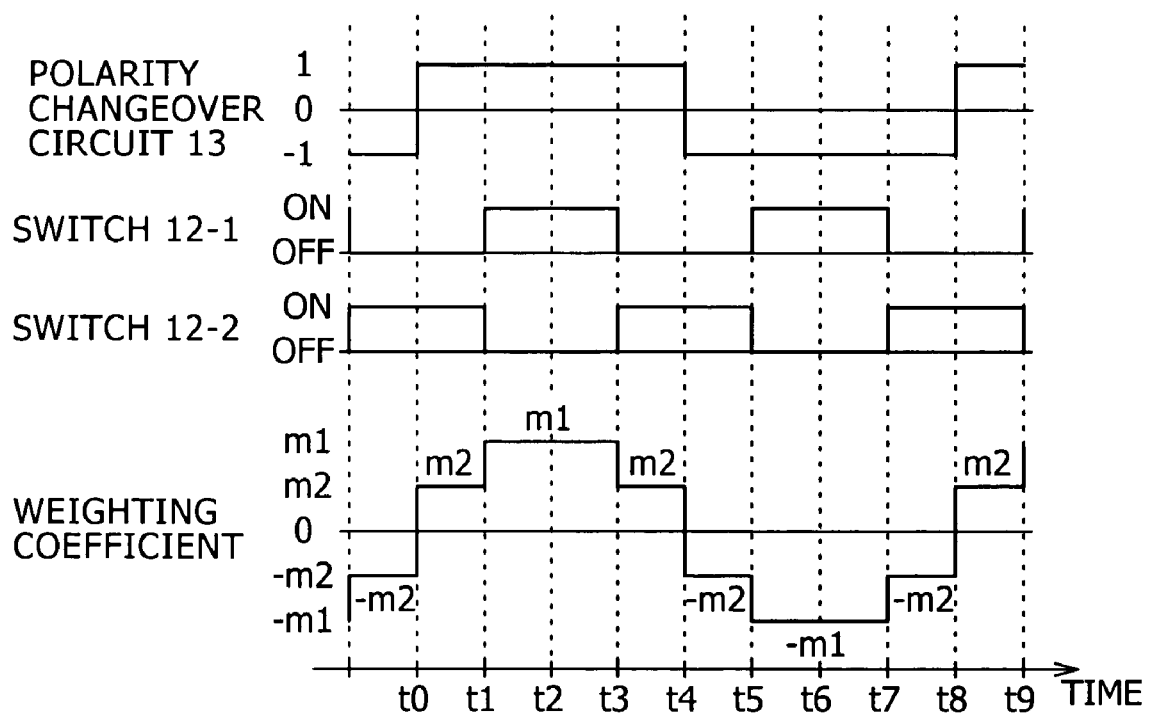
FIG. 2 is a timing chart illustrating circuit operation of the sine wave multiplication circuit of FIG. 1.

Now, circuit operation of the sine wave multiplication circuit according to the present embodiment having the configuration described above is described with reference to a timing chart of FIG. 2. Here, a case wherein two coefficient circuits 11-1 and 11-2 are provided is examined as the simplest example of the sine wave multiplication circuit.

The polarity changeover circuit 13 assumes the positive polarity (coefficient 1) within a period of time from t0 to t4 and then assumes the negative polarity (coefficient −1) within another period of time from t4 to t8. The coefficient selection switch 12-1 exhibits an on (closed) state within a period of time from t1 to t3 and another period of time from time t5 to t7, and the coefficient selection switch 12-2 exhibits an on state within a period of time from t3 to t5 and another period of time from t7 to t9. Thereafter, the coefficient selection switches 12-1 and 12-2 repeat the on states described above. As a result, the time variation of the weighting coefficient mo(t) with respect to the analog input signal vin(t) becomes such as illustrated in FIG. 2. The weighting coefficient mo(t) can exhibit four coefficients of m1, m2, −m1 and −m2.

Figure 3:
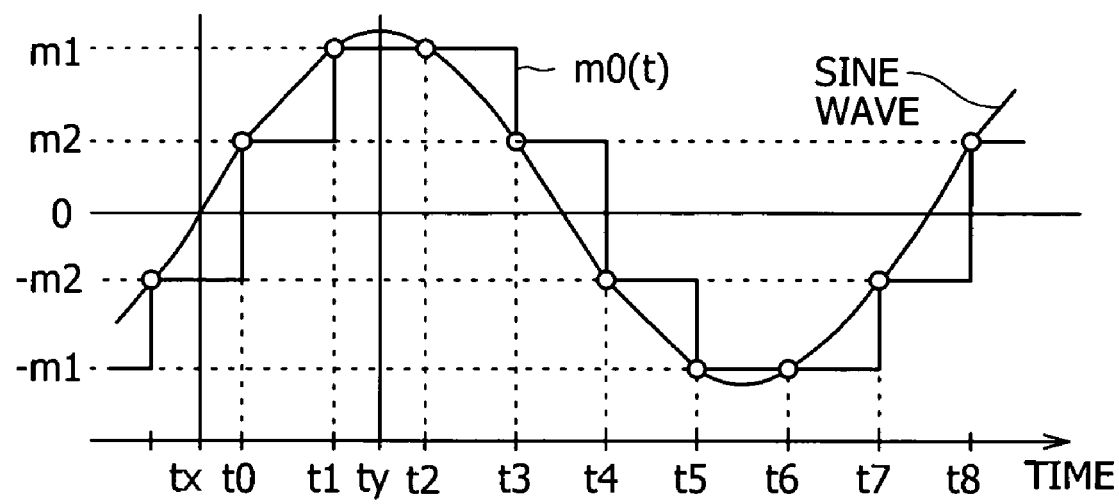
FIG. 3 is a waveform diagram illustrating the necessity for a coefficient to satisfy a certain condition.

The coefficients m1 and m2 and the coefficients −m1 and −m2 must satisfy certain conditions. FIG. 3 illustrates the conditions just mentioned. Referring to FIG. 3, the coefficients m1 and m2 and the coefficients of −m1 and −m2 must increase in proportion to instantaneous values of the sine wave signal when 4n sampling points are selected at equal intervals within one cycle of the sine wave signal symmetrically with respect to time ty of a peak value of the sine wave signal without including the time ty. In other words, the 4n sampling points are selected symmetrically with respect to a zero-cross point tx.

Figure 4:
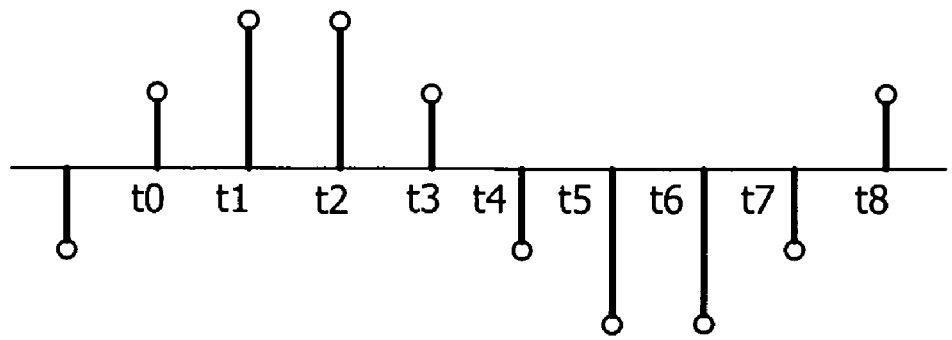
FIG. 4 is a diagram illustrating weighting coefficients at different time units.
Figure 5:
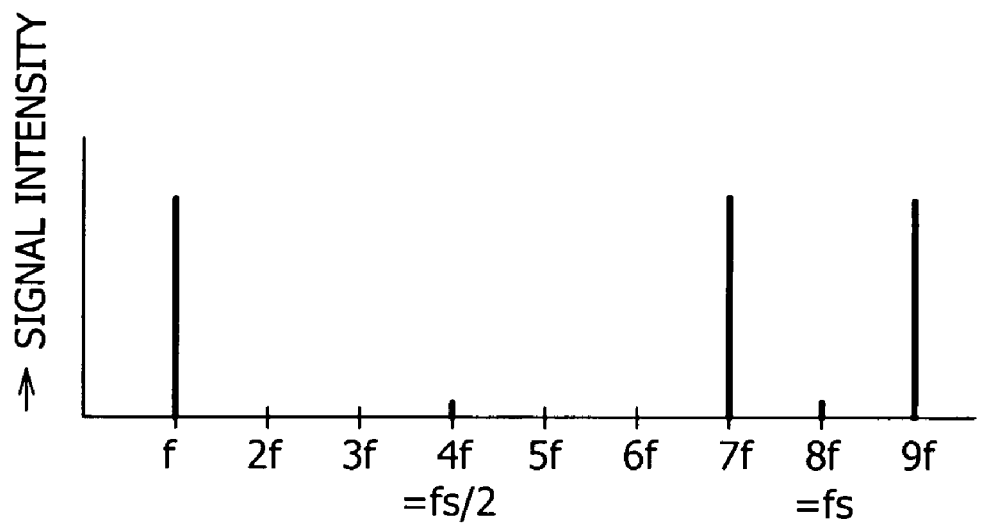
FIG. 5 is a diagram illustrating spectra of the weighting coefficients.

The weighting coefficient mo(t) at a time unit ti is a sample obtained by sampling the sine wave signal as seen in FIG. 4. Where n coefficient circuits 11 are involved, 2n weighting coefficients mo(t) are obtained including positive and negative weighting coefficients. Since each weighting coefficient is used twice within one cycle, the sine wave signal is sampled by 4n times within one cycle. Since n=2 in the present example, the weighting coefficients involved are obtained by sampling the sine wave signal by 8 times. Where the spectrum of the weighting coefficients mo(t) of FIG. 4 is considered, such a spectrum as illustrated in FIG. 5 is obtained. Where the frequency of the sine wave signal is represented by f, since the sine wave signal is sampled by 8f, a desired signal exists at f, and a spectrum exists at 7f and 9f. Nothing exhibits between f and 7f.

Figure 6:
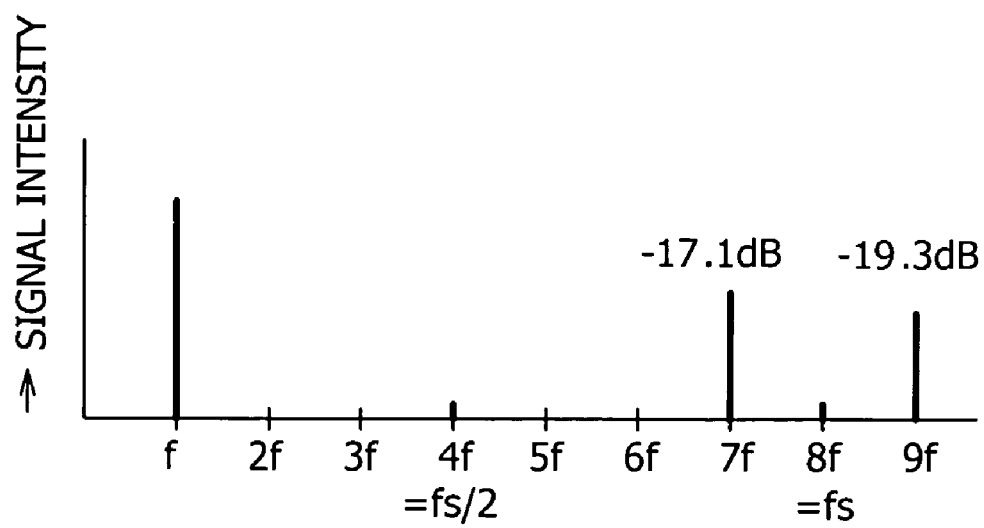
FIG. 6 is a diagram illustrating spectra of harmonic components of an actual weighting coefficient.

The actual weighting coefficients mo(t) do not exhibit a sampling waveform represented by a δ function (impulse train) but exhibits a staircase waveform obtained by first order holding of the sampling waveform. Harmonic components at this time have such a spectrum as illustrated in FIG. 6 because attenuation (Sinx/x) by a well-known aperture effect is applied to the harmonic components. The seventh-order harmonic component attenuates approximately by 17 dB, and the ninth-order harmonic component attenuates approximately by 19 dB. Since the seventh- and ninth-order harmonic components are spaced considerably from the basic wave, they can be attenuated considerably by passing them through a simple low-pass filter. The weighting coefficients m1 and m2 are determined setting the amplitude of the sine wave signal to be used for multiplication to 1.

Since time t0 in FIG. 3 is $\pi/8$, $m2=Sin(\pi/8)=0.383$. Meanwhile, since time t1 is $3\pi/8$, $m1=Sin(3\pi/8)=0.924$. If the coefficient circuit number n is increased, then unnecessary harmonic waves of the sine wave signal to be used for multiplication can be pushed aside toward a higher frequency band and hence be reduced in level.

Figure 7:
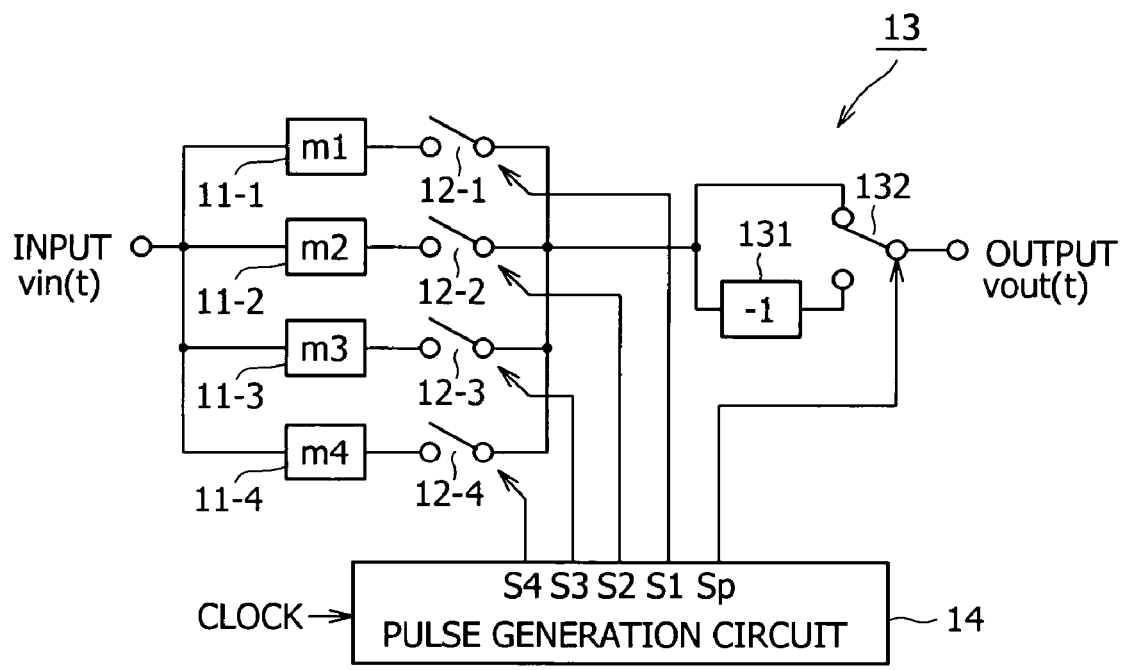
FIG. 7 is a block diagram of an example of the sine wave multiplication circuit having a configuration wherein n=4.
Figure 8:
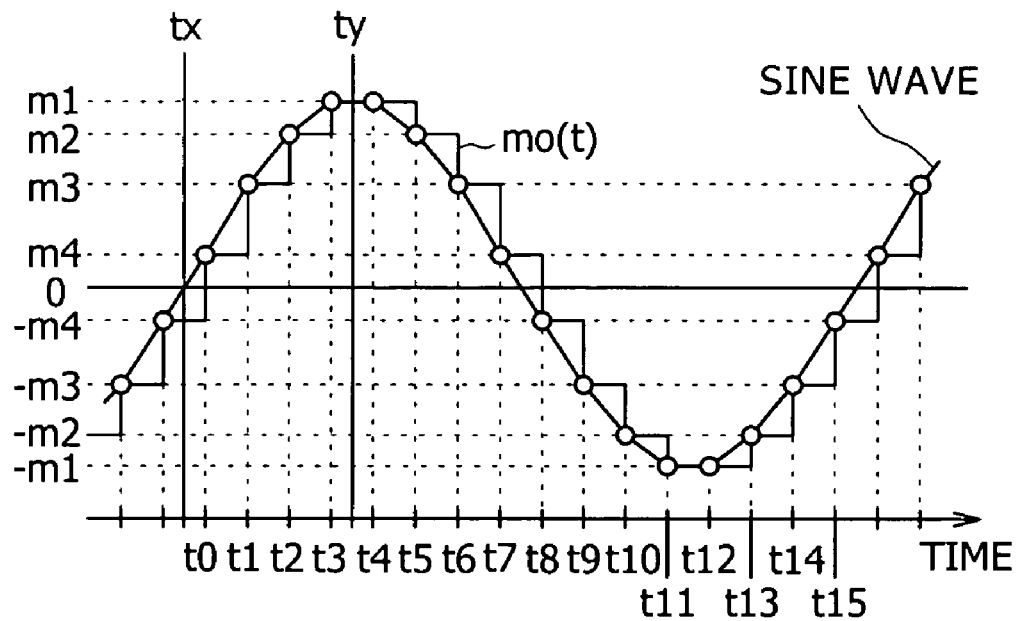
FIG. 8 is a waveform diagram illustrating an output waveform and weighting coefficients a different times of the sine wave multiplication circuit wherein n=4.

FIG. 7 shows an example of a configuration of the sine wave multiplication circuit where n=4. FIG. 8 illustrates an output waveform of the sine wave multiplication circuit of FIG. 7 and weighting coefficients mo(t) at different times.

Figure 9:
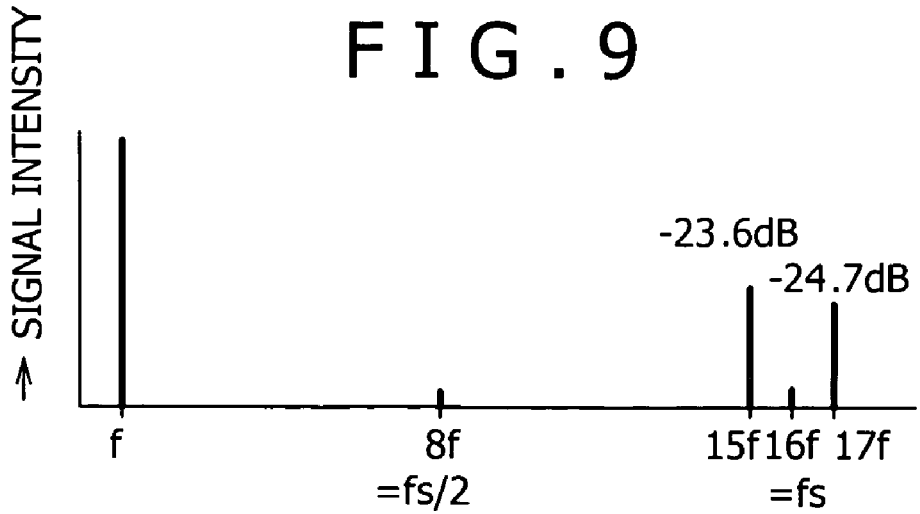
FIG. 9 is a diagram illustrating an output spectrum of the sine wave multiplication circuit wherein n=4.

As seen in FIG. 8, the output of the sine wave multiplication circuit of FIG. 7 exhibits a staircase waveform having eight values (m1 to m4 and −m1 to −m4) and is obtained by sampling the sine wave signal by 16 times. Where the amplitude of the sine wave signal to be used for multiplication is represented by 1, the weighting coefficients m1 to m4 have such values as given below. In particular, $m4=Sin(\pi/16)=0.195$, $m3=Sin(3\pi/16)=0.556$, $m2=Sin(5\pi/16)=0.831$, and $m1=Sin(7\pi/16)=0.981$. FIG. 9 illustrates an output spectrum where n=4. Although the attenuation of harmonic components is approximately 6 dB, since the harmonic components are the fifteenth- and seventeenth-order harmonic components having frequencies substantially equal to twice, they can be attenuated using a very simple filter.

Now, requirements in sampling of a sine wave signal by the sine wave multiplication circuit of the present embodiment are described.

Figure 10:
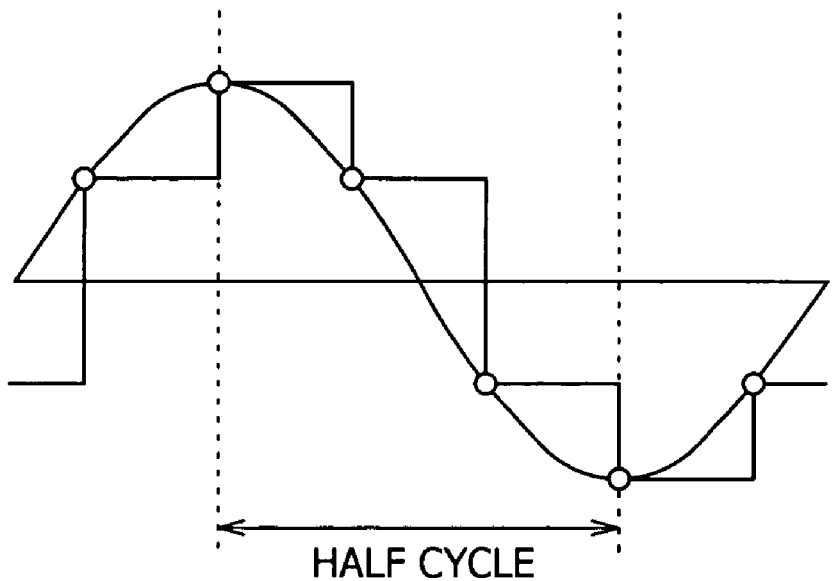
FIG. 10 is a waveform diagram illustrating sampling points which include a maximum value and an output waveform of the sine wave multiplication circuit.
Figure 11:
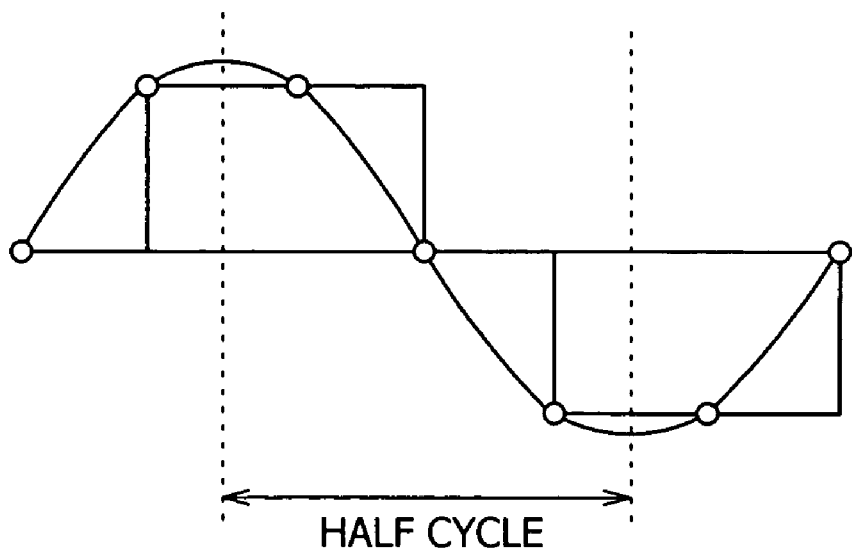
FIG. 11 is a similar view but illustrating sampling points and the output waveform of the sine wave multiplication circuit where the sampling points are selected including a zero cross but not including a maximum point.

In the sine wave multiplication circuit of the present embodiment, one weighting coefficient is basically used twice in one cycle. Further, the number of sampling points must be an even number because positive and negative portions of the sine wave signal are sampled symmetrically. In the following description, the number of sampling points in one half cycle is represented by k. k=2, that is, four-time sampling, is basically meaningless. In four-time sampling, a reflected spectrum appears at the three-time sampling point and a third-order harmonic wave is generated, and therefore, no essential difference appears from a rectangular wave. The smallest sampling number k with which the present invention is significant is k=3, that is, 6 times.

Where k is an odd number (sampling number 2k=6, 10, 14, . . . ), the sampling points include one of a maximum value and a zero cross. 2k=4 is excepted because it is smaller than 6. FIG. 10 shows sampling points including a maximum value and an output waveform. In this instance, n=k/2+0.5. A peak weighting coefficient is used twice within one cycle while the other weighting coefficient is used four times. FIG. 11 shows sampling points and an output waveform when sampling points including a zero cross are selected. In this instance, n=k/2+0.5. The weighting coefficient of zero is used twice within one cycle while the other weighting coefficient is used four times. The two cases do not have an essential difference while only the sampling points are different between them. It may be safely said that, since the sampling points of FIG. 11 include a zero cross, one of the weighting coefficients is zero and there is a merit that the substantial number of weighting coefficient circuits decreases.

Figure 12:
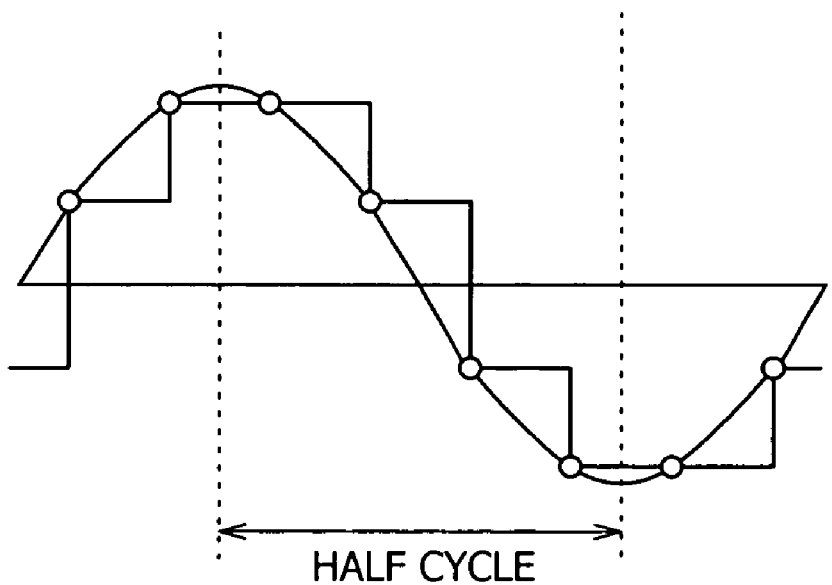
FIG. 12 is a similar view but illustrating an output waveform of the sine wave multiplication circuit where the sampling points are selected without including any of a maximum point and a zero cross.
Figure 13:
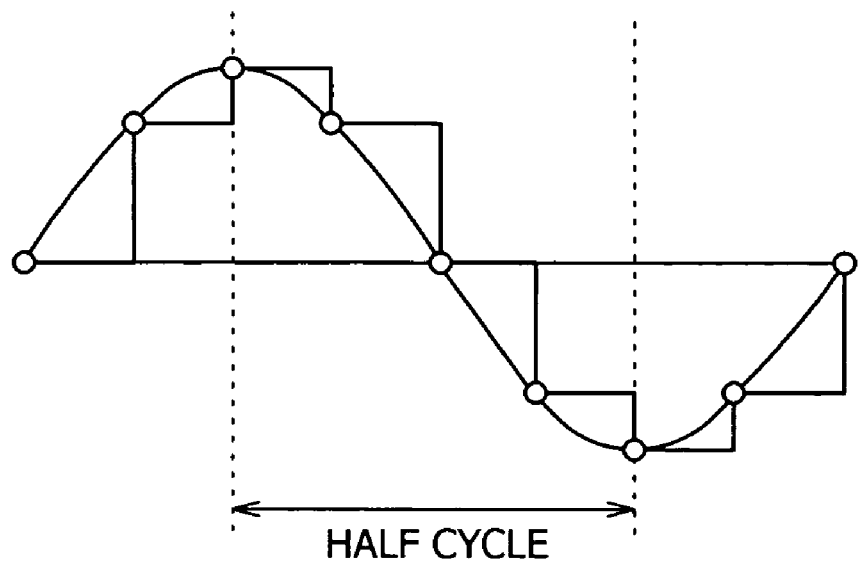
FIG. 13 is a similar view but illustrating the output waveform of the sine wave multiplication circuit where the sampling points are selected including both of a maximum point and a zero cross.

Now, a case wherein k is an even number (sampling number 2k=8, 12, 16, . . . ) is examined. 2k=4 is excepted because it is lower than 6. Also in this instance, two arrangements of sampling points are available. FIG. 12 shows sampling points and an output waveform when the sampling points are selected so as not to include any of a maximum value and a zero cross. In this instance, n=k/2. One weighting coefficient is used four times within one cycle. FIG. 13 shows sampling points and an output waveform when the sampling points are selected so as to include both of a maximum value and a zero cross. In this instance, n=k/2+1. A peak weighting coefficient and a maximum weighting coefficient are used only twice within one cycle. The other weighting coefficients are used four times. Where the two cases are compared with each other, while the sampling of FIG. 12 requires two weighting coefficients, the sampling of FIG. 13 requires three weighting coefficients including zero. Further, also the pulse signal for changing over the coefficient of the weighting circuit 10 can be generated more readily for the sampling of FIG. 12.

Accordingly, it is reasonable to arrange sampling points so as not to include any of a maximum value and a zero cross.

If the relative merits of k=3 and k=4, that is, six-time sampling and eight-time sampling, are considered, then the eight-time sampling of k=4 is superior. This is because a sine wave signal having a higher sampling frequency, that is, having a higher degree of accuracy, can be generated using same two weighting circuits 10.

Even if k further increases, the same basic rule applies. Where k is an odd number, sampling points including one of a maximum value and a zero cross are selected. The arrangement of sampling points which include a zero cross is rather reasonable. The number n of necessary weighting coefficients/circuits is a number obtained by rounding up k/2. Where k is an even number, either sampling points which does not include any of a maximum value and a zero cross are selected or sampling points which include both of them are selected. The number n of necessary weighting coefficients/circuits is k/2. Irrespective of whether k is an odd number or an even number, if a zero cross point is selected, then one of the weighting coefficients is zero.

Unless a special reason is applicable, it is most reasonable to set the sampling number k within one half cycle to an odd number and select such sampling points which do not include any of a maximum value and a zero cross and are symmetrical with respect to a line where a maximum value is selected but with respect to a point where a zero cross is selected. Further, $k^{2i}$ (i is an integer) is useful including easiness in pulse generation. In particular, eight-time sampling of k=4, 16-time sampling of k=8 and 32-time sampling of k=16 are considered useful in practical use.

It is to be noted that the weighting circuit 10 uses a number of weighting coefficients which is greater than 1 and is further greater than n-2 at least twice within one half cycle of a sine wave signal. In particular, since n is equal to or greater than 2, in the case of n=2 or n=3, one or more weighting coefficients are used at least twice within one half cycle of the sine wave signal, and in the case of n=4 or more, 2 (=4-2) or more weighting coefficients are used at least twice within one half cycle of the sine wave signal.

CIRCUIT EXAMPLE 1

Figure 14:
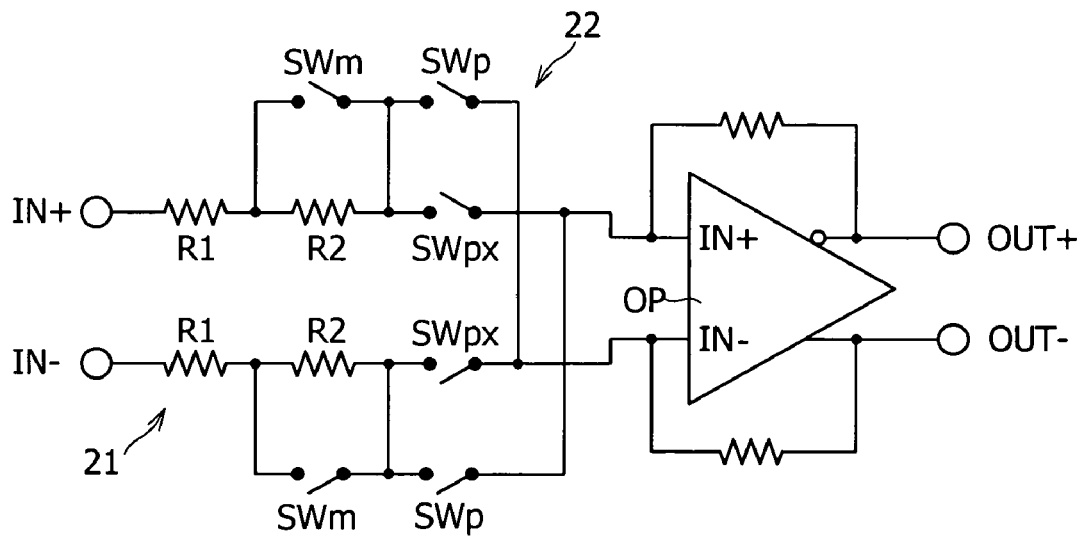
FIG. 14 is a circuit diagram showing an example of a weighting circuit and a polarity changeover circuit of the sine wave multiplication circuit.

Now, particular circuit examples of the weighting circuit 10 and the polarity changeover circuit 13 are described. FIG. 14 shows a circuit example (circuit example 1) which has two addition coefficients and operates with k=4, that is, eight-time sampling.

Various methods are applicable to implement the weighting circuit 10 and the polarity changeover circuit 13. In FIG. 14, a circuit example which uses an operational amplifier OP having differential inputs/outputs is shown. Where the weighting circuit 10 and the polarity changeover circuit 13 are implemented using differential inputs/outputs in this manner, they can be implemented very simply. In particular, the weighting circuit 10 and the polarity changeover circuit 13 can be formed from a resistor network 21 including resistors R1 and R2 and a switch circuit 22 including switches SWm, SWp and SWpx. The switch SWm is used to change over the weighting coefficient, and the switches SWp and SWpx are used to change over the polarity. The switch SWpx operates with the opposite polarity to that of the Switch SWp.

Figure 15:
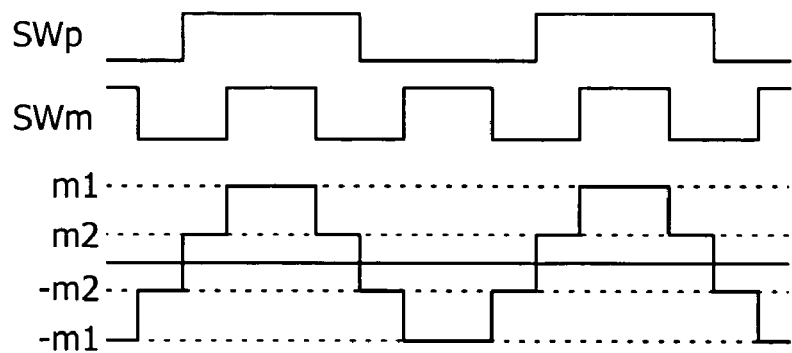
FIG. 15 is a waveform diagram illustrating control of switches and weighting coefficients of the weighting circuit and the polarity changeover circuit of FIG. 14.

FIG. 15 illustrates control of the switches SWp and SWm and the coefficients m1, m2, −m1 and −m2. When the switch SWm is on, the weighting coefficient depends upon an inverse number to the resistance value of the resistors R1 and provides m1 or −m1. When the switch SWm is off, the weighting coefficient depends upon an inverse number to the resistors R1+R2 and provides m2 or −m2. The switches SWm, SWp and SWpx are implemented representatively by a CMOS switch.

Where the weighting circuit 10 and the polarity changeover circuit 13 have such a circuit configuration that they are formed from the resistor network 21 and the switch circuit 22 and a weighting coefficient is obtained by changing over the transmission gain by means of the switches SWm, SWp and SWpx, there is an advantage that an offset or an error of a coefficient can be suppressed to a very low value when compared with those where they are formed using a transistor as in the Gilbert type multiplier of the prior art described hereinabove.

CIRCUIT EXAMPLE 2

Figure 16:
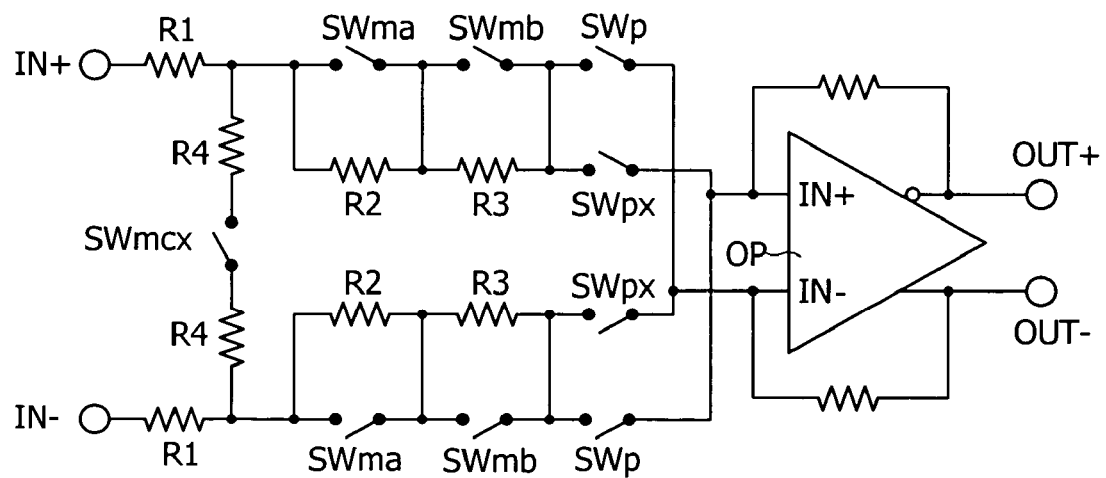
FIG. 16 is a circuit diagram showing another example of the weighting circuit and the polarity changeover circuit of the sine wave multiplication circuit.
Figure 17:
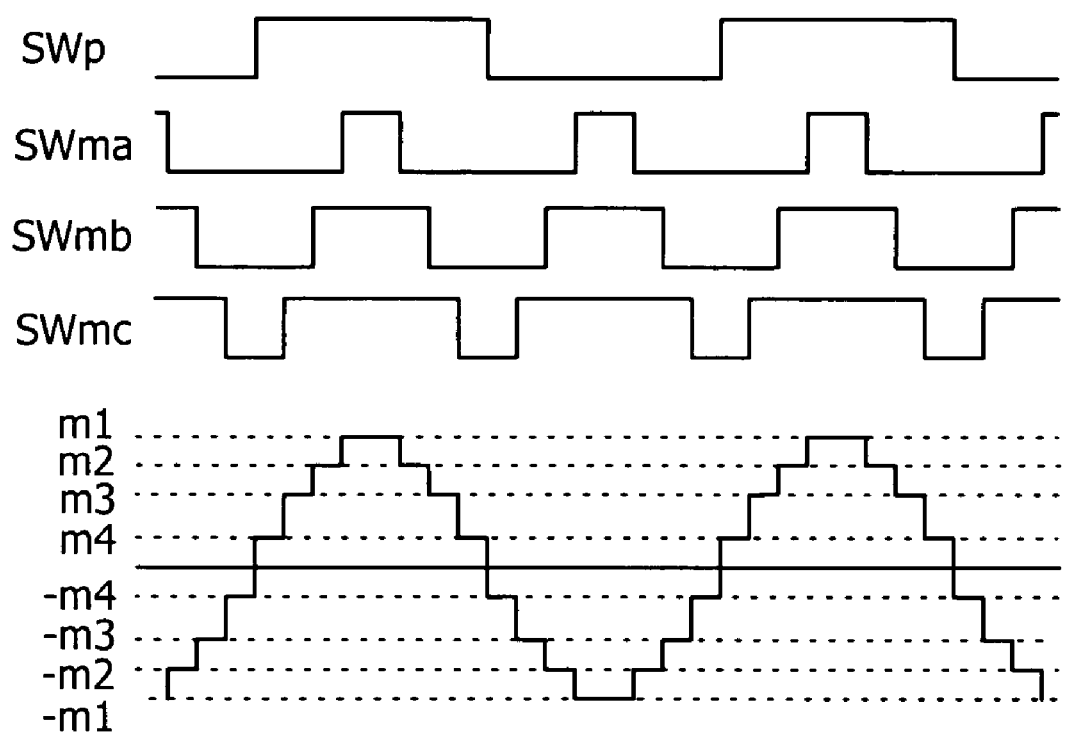
FIG. 17 is a waveform diagram illustrating control of switches and weighting coefficients of the weighting circuit and the polarity changeover circuit of FIG. 16.

FIG. 16 shows a particular circuit example (circuit example 2) of the weighting circuit 10 and the polarity changeover circuit 13 where k=8, that is, for 16-time sampling. FIG. 17 illustrates control of switches and weighting coefficients in the case of the circuit example 2. Switches SWp and SWpx for changing over the polarity are same as those in the circuit example 1. In the present circuit example, three different types of switches SWma, SWmb and SWmcx are used in order to change over the weighting coefficient among four different weighting coefficients.

When to provide a maximum weighting coefficient m1, the switches SWma and SWmb are on and the switch SWmcx is off. If the switches SWma are turned off in this state, then the weighting coefficient m2 is provided, and if the switches SWmb are turned off further, then the weighting coefficient m3 is provided. If the switch SWmcx is turned on further, then the minimum weighting coefficient m4 is provided. Since the switches SWma, SWmb and SWmc are represented in FIG. 17 such that the weighting coefficient increases when any of them is on, two resisters R4 in FIG. 16 are short-circuited, and the switch SWmcx is used as a switch for lowering the weighting coefficient and it is represented such that the switch SWmcx exhibits an off state when the switch SWmc of FIG. 17 exhibits an on state.

Now, different measures for implementing the weighting circuit 10 and the polarity changeover circuit 13 are described.

Where an MOS device can be used, such measures which use the resistor network 21 and the switch circuit 22 as shown in FIG. 14 or 16 are most easy to implement and allow achievement of a good result. However, where only a bipolar device can be used, bidirectional switches like MOS switches cannot be implemented simply. In such an instance, the weighting circuit 10 and the polarity changeover circuit 13 can be implemented using a buffer circuit which equivalently has an input switch function.

CIRCUIT EXAMPLE 3

Figure 18:
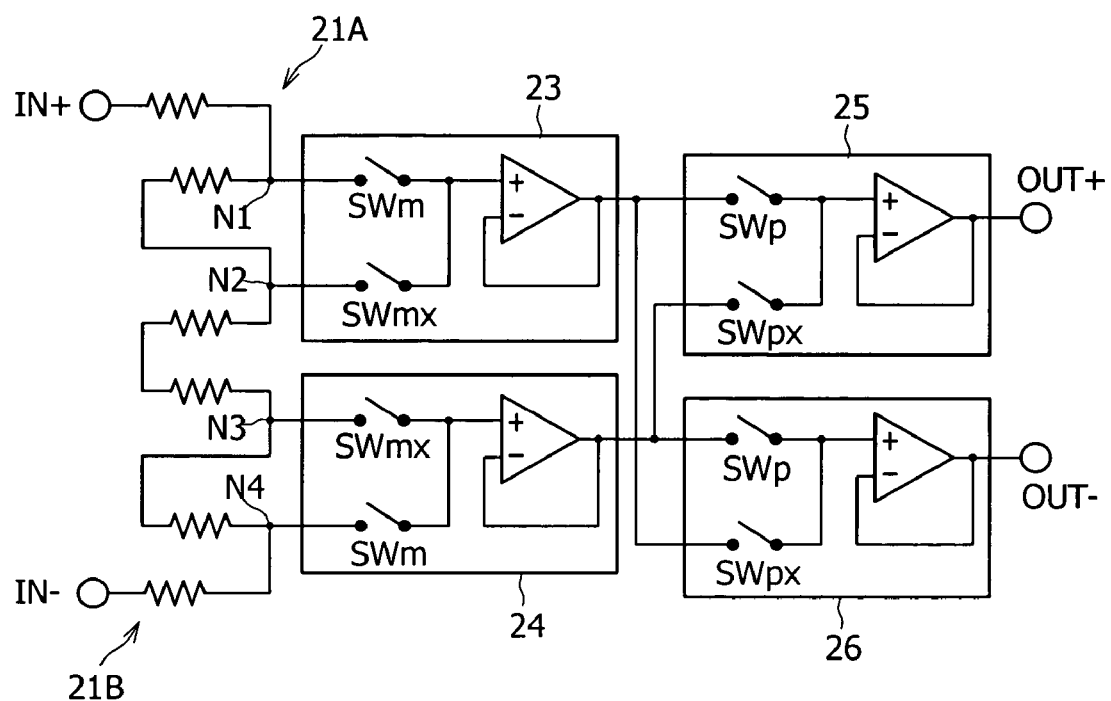
FIG. 18 is a circuit diagram showing a further example of the weighting circuit and the polarity changeover circuit formed using a buffer circuit equivalently having an input switch function.
Figure 19:
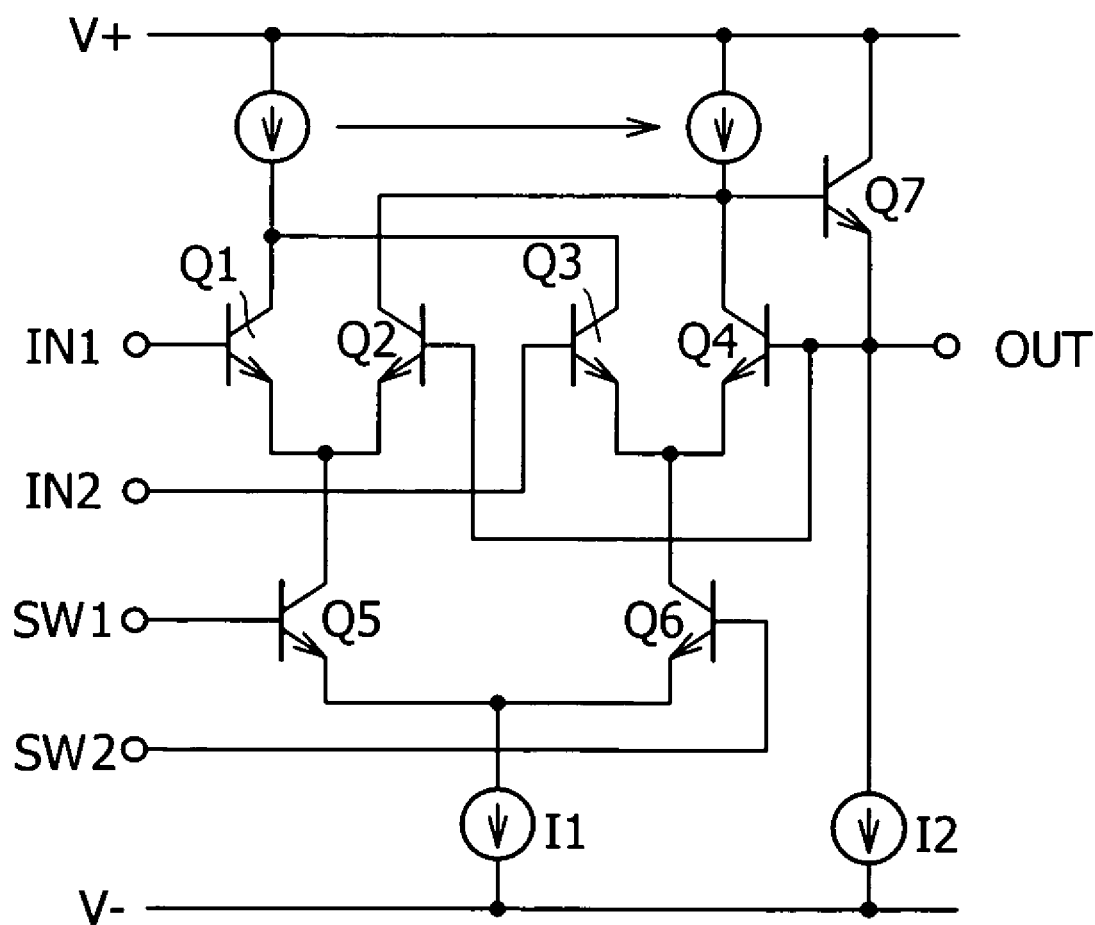
FIG. 19 is a circuit diagram showing an example of a configuration of buffer amplifier with an input switch function of the sine wave multiplication circuit.

FIG. 18 shows a circuit example (circuit example 3) implemented by a buffer circuit equivalently having an input switch function.

Referring to FIG. 18, the sine wave multiplication circuit according to the circuit example 3 includes a buffer amplifier 23 having two inputs to which potentials as nodes N1 and N2 of a resistor network 21A formed from three resistors connected in series between an input in+ to the sine wave multiplication circuit and the ground. The sine wave multiplication circuit further includes another buffer amplifier 24 having two inputs to which potentials at nodes N3 and N4 of another resistor network 21B formed from three resistors connected in series between the other input in– to the sine wave multiplication circuit and the ground. The sine wave multiplication circuit further includes a further buffer amplifier 25 having two inputs to which outputs of the buffer amplifiers 23 and 24 are inputted, and a still further buffer amplifier 26 having two inputs to which the outputs of the buffer amplifiers 23 and 24 are inputted.

Each of the buffer amplifiers 23 to 26 includes switches at two input stages thereof. Each of the buffer amplifiers 23 to 26 with an input switch function can be implemented, for example, by a buffer amplifier which can select and extract one of input signals IN1 and IN2 at an output OUT thereof by changing over the current of transistors Q5 and Q6 to activate first differential pair transistors Q1 and Q2 or activate second differential pair transistors Q3 and Q4.

In the following, applications of the present invention are described.

Application 1

Figure 20:
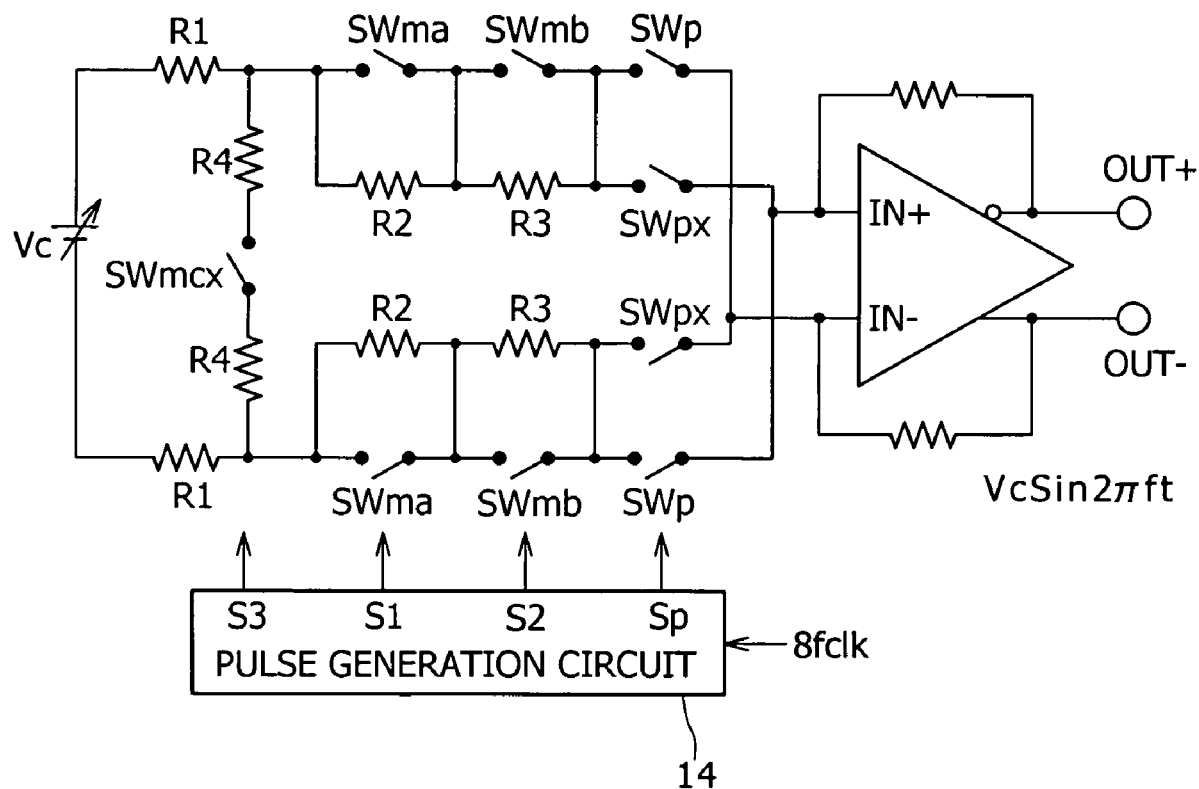
FIG. 20 is a circuit diagram showing a sine wave generation circuit to which the sine wave multiplication circuit is applied.

FIG. 20 shows an example of a configuration of a sine wave multiplication circuit which uses the circuit example 2 (FIG. 16) as the weighting circuit 10 and the polarity changeover circuit 13 to generate a sine wave signal having a very high degree of amplitude accuracy. In the sine wave multiplication circuit of the present configuration example, the amplitude of the output can be set with a high degree of accuracy by providing an amplitude control voltage Vc across the inputs in + and in– so that the amplitude of the output is controlled with the amplitude control voltage Vc. A clock having a frequency equal to eight times the frequency f of the sine wave signal to be used for multiplication is inputted to a pulse generation circuit 14. The pulse generation circuit 14 generates a switch control pulse illustrated in FIG. 17 based on the clock of the frequency equal to eight times the frequency f. Also it is possible to achieve amplitude modulation with a high degree of accuracy if an arbitrary signal is applied to the amplitude control voltage Vc.

Application 2

Figure 21:
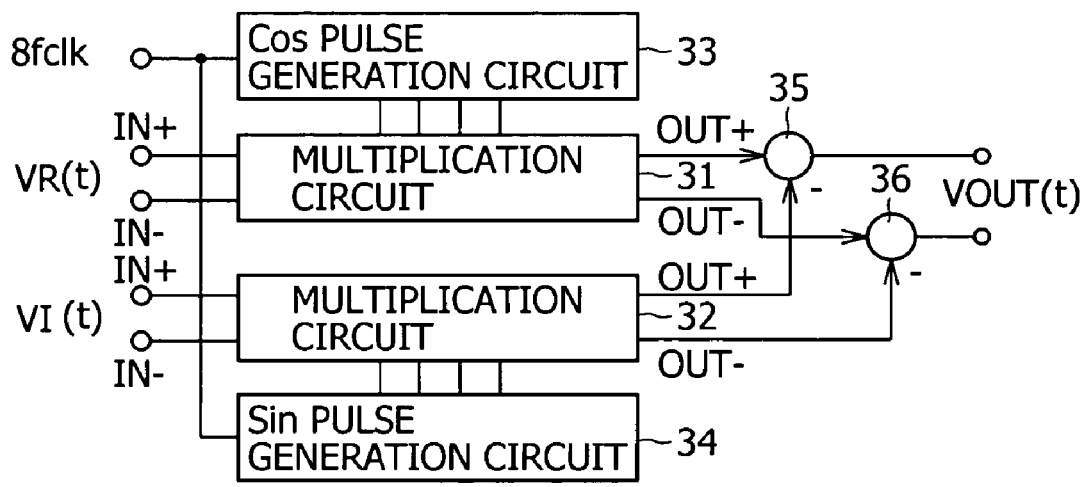
FIG. 21 is a block diagram showing a multiplication circuit to which the sine wave multiplication circuit is applied.

FIG. 21 shows an example of a configuration of a sine wave multiplication circuit according to an application 2 wherein an input complex signal is multiplied by a complex signal of a frequency f.

As can be seen apparently from FIG. 21, the sine wave multiplication circuit according to the present application 2 includes a multiplication circuit 31 to which a first analog signal VR(t) is inputted, another multiplication circuit 32 to which a second analog signal VI(t) is inputted, and a Cos pulse generation circuit 33 and a Sin pulse generation circuit 34 serving as a control section for controlling the multiplication circuits 31 and 32. The sine wave multiplication circuit further includes an addition circuit 35 for receiving an output signal OUT+ of the multiplication circuit 31 as an addition input and receiving an output signal OUT+ of the multiplication circuit 32 as a subtraction input, and another addition circuit 36 for receiving the other output OUT– of the multiplication circuit 31 as an addition input and receiving the other output OUT– of the multiplication circuit 32 as a subtraction input.

In the sine wave multiplication circuit according to the application 2 having the configuration described above, for example, the sine wave multiplication circuit according to the circuit example 2 of FIG. 16 is used as it is as the multiplication circuit 31 and the multiplication circuit 32. The Cos pulse generation circuit 33 and the Sin pulse generation circuit 34 generate a Cos signal and a Sin signal, respectively, which have phases displaced by $\pi/2$ from each other based on a clock clk having a frequency of 8f and control the weighting coefficients of the multiplication circuits 31 and 32 so that output signals of the multiplication circuits 31 and 32 may be orthogonal to each other.

Where the input signal is represented by $Ase^{j\omega st}$ and the clock is represented by $e^{j\omega ct}$, the sine wave multiplication circuit according to the application 2 executes the following arithmetic operation:

$$Re[Ase^{j\omega st}e^{j\omega ct}]=Cos(\omega st)\cdot Cos(\omega ct)-Sin(\omega st)\cdot Sin(\omega ct)= Cos\{(\omega s+\omega c)t\} \quad (3)$$

This is determination of the real part of complex multiplication of two complex frequencies. Also it is possible to prepare another sine wave multiplication circuit according to the application 2 to add a circuit for performing multiplication of the real part and the imaginary part so that a full complex output can be obtained.

A frequency of a sum or a difference can be generated accurately by performing complex multiplication of sine wave signals in this manner. Although such multiplication is possible with a conventional analog multiplication circuit such as, for example, an analog multiplier called Gilbert type, the conventional analog multiplication circuit is not very practical because the feed-through, image and so forth of a signal are very high from the problems of the offset voltage, linearity, dynamic range and so forth. In contrast, where the multiplication circuit according to the present invention is used, multiplication of a very high degree of accuracy can be achieved.

Figure 22:
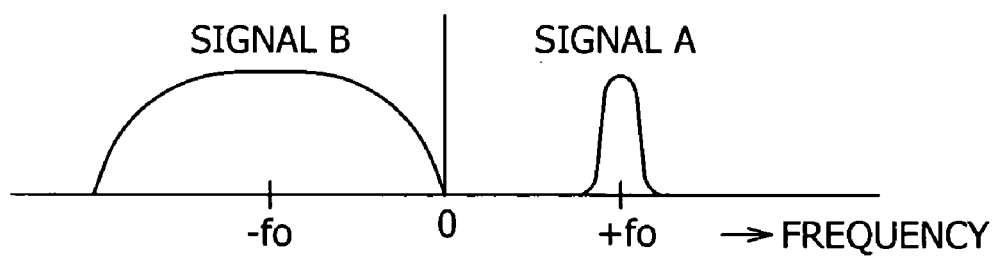
FIG. 22 is a waveform diagram illustrating a complex signal which includes a desired signal at a frequency and includes a disturbance signal at another frequency.
Figure 23:
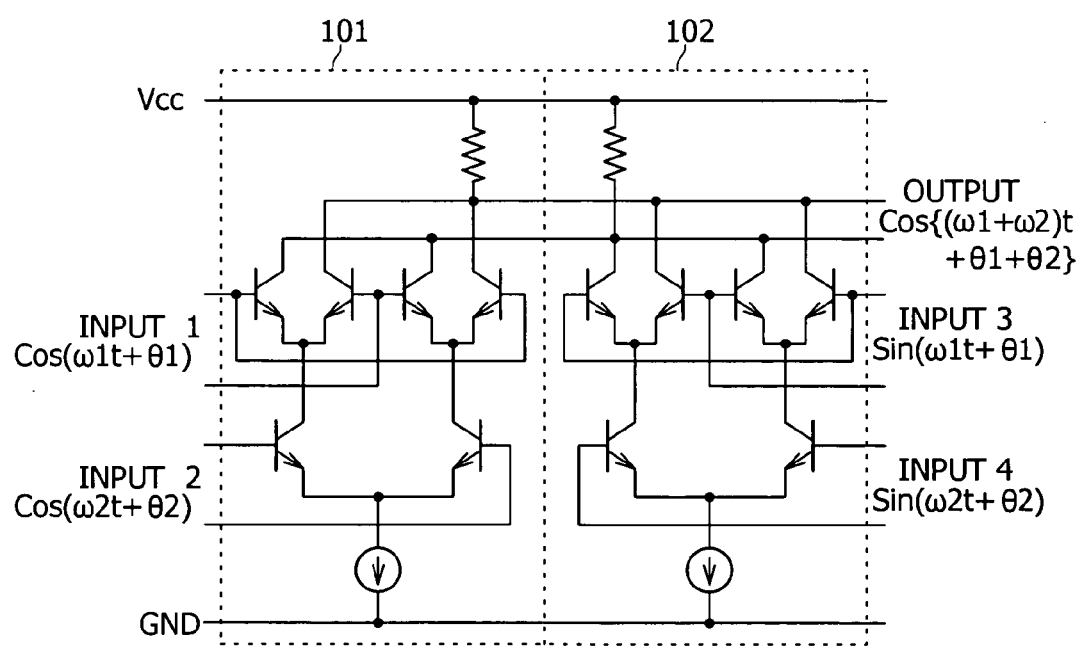
FIG. 23 is a circuit diagram showing a conventional complex multiplication circuit by a multiplication circuit (Gilbert multiplier)
Figure 24A:
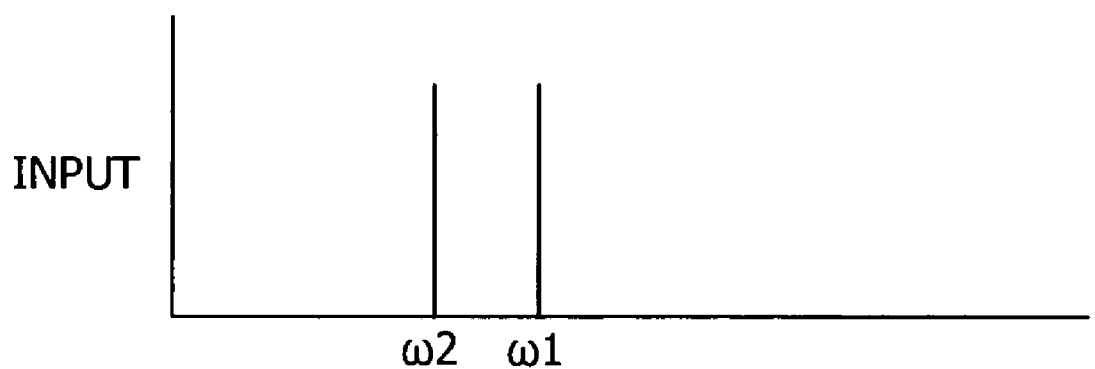
FIGS. 24A and 24B are diagrams illustrating a signal spectrum of feed-throughs and an image component.
Figure 24B:
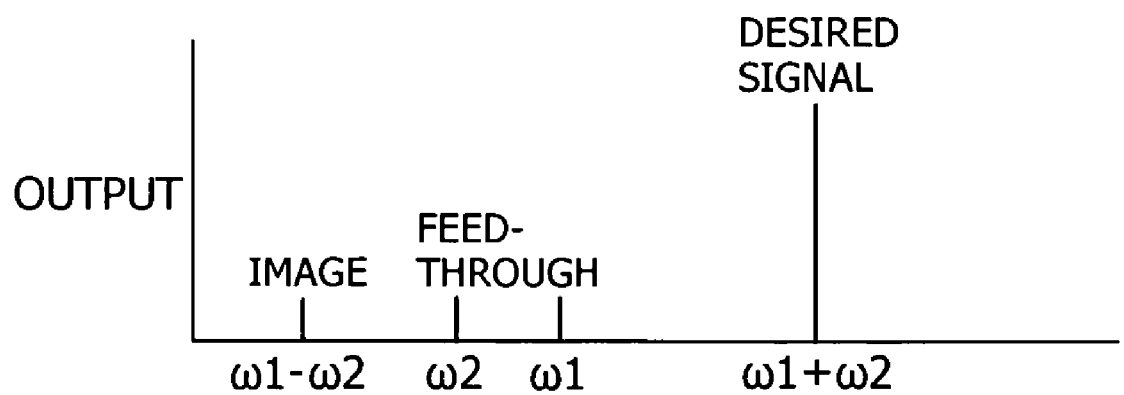

Furthermore, although multiplication of a sine wave signal and an analog signal is a basic function of signal processing, the multiplication circuit of the present invention can achieve implementation of a process which cannot conventionally be placed into practical use from a restriction to the performance of an analog multiplication circuit. For example, where a desired signal exists at a frequency fo and a disturbance signal exits at the frequency –fo in a complex signal as seen in FIG. 22, implementation of extraction only of the frequency fo by an analog circuit is restricted very much in terms of performance. However, according to the present invention, since complex multiplication of an arbitrary frequency can be performed with a very high degree of accuracy, it is possible to down convert the frequency fo into dc current or covert the frequency fo into an arbitrary frequency readily while minimizing the influence of a disturbance wave of the frequency –fo of an image component. Thus, the possibility of signal processing by an analog circuit can be expanded significantly.

While a preferred embodiment of the present invention has been described using specific terms, such description is for illustrative purposes only, and it is to be understood that changes and variations may be made without departing from the spirit or scope of the following claims.

What is claimed is:

1. An electronic circuit for signal processing, comprising:
   (a) a first multiplication section, configured to multiply a first analog signal by a sine wave signal, and comprising
      (1) a first weighting section having n weighting coefficients, each having a unique value, for multiplying the first analog input signal by the weighting coefficients and outputting a first weighted analog signal, n being an integer equal to or greater than 2,
      (2) a first polarity changeover section for changing the polarity of the first weighted analog signal outputted from said weighting section, and
      (3) a first control section for performing changeover among the n weighting coefficients and changeover of the polarity after every sampling period equal to $\frac{1}{2}k$ of one period of the sine wave signal by which the first analog input signal is multiplied, k being an integer, 2k being equal to or greater than 6 but equal to or smaller than 4n;
- (b) a second multiplication section, configured to multiply a second analog signal by a cosine wave signal, and comprising
  - (1) a second weighting section having n weighting coefficients for multiplying the second analog input signal by the weighting coefficients and outputting a weighted analog signal, n being an integer equal to or greater than 2,
  - (2) a second polarity changeover section for changing over the polarity of the weighted analog signal outputted from said weighting section, and
  - (3) a second control section for performing changeover among the n weighting coefficients and changeover of the polarity after every sampling period equal to ½k of one period of the cosine wave signal by which the analog input signal is multiplied, k being an integer, 2k being equal to or greater than 6but equal to or smaller than 4n;
  - wherein output signals of said first and second multiplication sections are orthogonal to each other; and
- (c) an addition section for adding the output signals of said first and second multiplication sections.

2. The electronic circuit according to claim 1, wherein at least one of said first weighting section, said second weighting section, said first polarity changeover section, and said second polarity changeover section is formed from a resistor network and a switch element such that a transmission gain is changed over by said switch element.

3. The electronic circuit according to claim 1, wherein at least one of said first weighting section and said second weighting section multiplies positive and negative inputs by a same one of the weighting coefficients, and a corresponding polarity changeover section extracts the positive and negative inputs given thereto from said weighting section as a positive phase output and an opposite phase output thereof.

4. A signal processing method, comprising the step of:
adding, with an addition section of an electronic circuit, an output signal of a first multiplication section and an output signal of a second multiplication section of said electronic circuit, wherein:
- (a) the output signal of the first multiplication section result from said first multiplication section performing the steps of:
  - (1) multiplying a first analog input signal by n weighting coefficients, each having a unique value, and outputting a first weighted analog signal, n being an integer equal to or greater than 2;
  - (2) changing the polarity of the first weighted analog signal; and
  - (3) performing changeover among the n weighting coefficients and changeover of the polarity after every sampling period equal to ½k of one period of a sine wave signal by which the first analog input signal is multiplied, k being an integer, 2k being equal to or greater than 6 but equal to or smaller than 4n;
- (b) the output signal of the second multiplication section result from said second multiplication section performing the steps of:
  - (1) multiplying a second analog input signal by n weighting coefficients, each having a unique value, and outputting a second weighted analog signal, n being an integer equal to or greater than 2;
  - (2) changing the polarity of the second weighted analog signal; and
  - (3) performing changeover among the n weighting coefficients and changeover of the polarity after every sampling period equal to ½k of one period of a cosine wave signal by which the second analog input signal is multiplied, k being an integer, 2k being equal to or greater than 6 but equal to or smaller than 4n; and
- (c) said output signals of said first and second multiplication sections are orthogonal to each other.

\* \* \* \* \*